United States Patent [19]

Choi

[11] Patent Number: 5,001,036

[45] Date of Patent: Mar. 19, 1991

[54] MULTI-LAYER PEEL-APART PHOTOSENSITIVE REPRODUCTION ELEMENT CONTAINING A PHOTORELEASE LAYER

[75] Inventor: John H. Choi, Sayre, Pa.

[73] Assignee: E. I. Du Pont de Nemours and Company, Wilmington, Del.

[21] Appl. No.: 357,849

[22] Filed: May 30, 1989

Related U.S. Application Data

[63] Continuation-in-part of Ser. No. 318,586, Mar. 3, 1989, abandoned.

[51] Int. Cl.$^5$ .............................................. G03C 1/492
[52] U.S. Cl. .................................... 430/271; 430/256; 430/258; 430/262; 430/263; 430/293
[58] Field of Search ............... 430/262, 263, 271, 293, 430/256, 258

[56] References Cited

U.S. PATENT DOCUMENTS

| | | | |
|---|---|---|---|
| 3,884,693 | 5/1975 | Bauer et al. | 430/262 |
| 4,282,308 | 8/1981 | Cohen et al. | 430/252 |
| 4,489,154 | 12/1984 | Taylor | 430/257 |
| 4,530,896 | 7/1985 | Christensen | 430/262 |

Primary Examiner—Jack P. Brammer

[57] ABSTRACT

This invention relates to a peel-apart photosensitive element comprising a strippable coversheet, a photorelease layer, a photohardenable layer, an elastomeric layer, and a support, which is useful in a variety of image reproduction processes.

15 Claims, No Drawings

MULTI-LAYER PEEL-APART PHOTOSENSITIVE REPRODUCTION ELEMENT CONTAINING A PHOTORELEASE LAYER

CROSS REFERENCE TO RELATED APPLICATION

This application is a continuation-in-part of U.S. Ser. No. 07/318,586 filed March 3, 1989, now abandoned.

FIELD OF THE INVENTION

This invention relates to a photosensitive element and processes for image reproduction. More particularly it relates to a photosensitive element comprising a strippable coversheet, a photorelease layer, a photohardenable layer, an elastomeric layer, and a support.

BACKGROUND OF THE INVENTION

Photosensitive elements which can be used in image-reproduction processes are well-known in the graphics arts industry. Such elements are exposed to actinic radiation through an image-bearing transparency, such as a color separation transparency, and developed to produce an image which is either positive or negative with respect to the transparency used. Positive-working elements produce an image which is a duplicate of the transparency through which they are exposed. Negative-working elements produce an image that is the reverse of the transparency through which they are exposed. After imagewise exposure, the photosensitive elements may be developed by washout of soluble image areas, toning tacky image areas with a colorant, peeling apart photoadherent layers, or combinations of these techniques. A series of images may be combined to form a color proof. A useful reference for color proofing methods is *Principles of Color Proofing*, by Michael H. Bruno, GAMA Communications, Salem, N.H., 1986.

In Cohen and Fan, U.S. Pat. No. 4,282,308, there is described a photohardenable element which is capable of producing reverse, colored images by a dry process without the need for toning with a colorant. The element comprises, in order from top to bottom, a strippable coversheet, a photoadherent layer containing a colorant, a tacky essentially nonphotosensitive elastomeric layer, and a support. After imagewise exposure to actinic radiation through the coversheet, the element can be peeled apart by peeling off the coversheet with the exposed areas of the colored photoadherent layer adherent thereto. The unexposed areas of the colored photoadherent layer remain on the supported elastomeric layer. When the imagewise exposure is through a negative transparency, and the exposed element is peeled apart, a positive image is obtained on the peeled-off coversheet and a negative image is obtained on the supported elastomeric layer. Imagewise exposure through a positive transparency, followed by peeling apart of the element, yields a negative image on the peeled-off coversheet and a positive image on the supported elastomeric layer.

Taylor, U.S. Pat. No. 4,489,154, describes a dry process for preparing a surprint proof without the need for toning with a colorant. This process uses an imagewise exposed, peel-apart photosensitive element comprising a strippable coversheet; a photoadherent layer containing a colorant; an essentially nonphotosensitive elastomeric layer; and a support. After exposure to actinic radiation through a positive image, e.g., a positive separation transparency, and peeling off the coversheet, a positive colored, photoadherent image remains on the supported elastomeric layer. This image is then adhered to a substrate. By repeating this process with different colored photoadherent layers, a multicolored surprint proof can be built up on the substrate If exposure is through a negative image, e.g., a negative separation transparency, a positive image is obtained on the coversheet.

It is sometimes desired to have a multilayer, peel apart photosensitive element in which the adhesive relationship of the layers is the reverse of that described above. After exposure, the unexposed areas of the photosensitive layer would adhere more strongly to the coversheet than to the elastomeric layer so that the unexposed, unhardened areas would be removed with the coversheet and the exposed, hardened areas would remain on the elastomeric layer. If the photosensitive layer were colored, exposure through a positive separation transparency would produce a positive, colored image directly on the coversheet. A series of such coversheets bearing different colored images could be combined to form a full color positive overlay proof. Such precolored elements would also be particularly useful for the preparation of negative-working, multicolor surprint proofs without the use of toners, and without the additional complication of an image transfer step, or the addition of an adhesive layer.

While it may be possible to change the adhesive relationships of the unexposed and exposed photohardenable layer, this is not an easy task. The multilayer, peel-apart photosensitive element requires a very delicate balance of adhesive/cohesive forces and other properties in order to function properly. The addition of new chemicals or the substitution of new chemicals for ones previously used may change the adhesive/cohesive properties but may, at the same time, adversely affect other important properties of the system. It is, therefore, desirable to achieve reversal of the adhesion properties, i.e., photorelease as opposed to photoadhesion, by a simple alteration of the coversheet.

BRIEF SUMMARY OF THE INVENTION

In one embodiment of this invention there is provided a multilayer, peel-apart photosensitive element comprising, in order from top to bottom:

(1) a strippable coversheet which is transparent to actinic radiation;

(2) a photorelease layer, consisting essentially of a solid, oxyethylene homopolymer photorelease agent of the formula, $H(OCH_2CH_2)_nOH$, with a molecular weight greater than about 3,000;

(3) a photohardenable layer, optionally containing a colorant;

(4) an essentially non-photosensitive organic elastomeric layer; and (5) a support sheet.

In a preferred embodiment of this invention the solid polymeric photorelease agent is a polyethylene oxide homopolymer with a molecular weight of about 100,000 to about 600,000, preferably about 300,000 to 400,000. The photorelease layer is preferably about 0.1 to 0.15 $\mu$m thick. The photohardenable layer of the invention preferably contains a colorant.

In another embodiment of this invention there is provided a method for preparing a precolored image suitable for use in an overlay proof, said process comprising:

(A) providing a precolored, peel-apart photosensitive element comprising, in order from top to bottom:
  (1) a strippable coversheet which is transparent to actinic radiation,
  (2) a photorelease layer, consisting essentially of a solid, oxyethylene homopolymer photorelease agent of the formula, $H(OCH_2CH_2)_nOH$, with a molecular weight greater than about 3,000;
  (3) a photohardenable layer comprising a colorant;
  (4) an essentially non-photosensitive organic elastomeric layer; and
  (5) a support sheet;
(B) exposing the element to actinic radiation through an image-bearing transparency; and
(C) peeling the strippable coversheet from the photohardenable layer, whereby the areas of the photohardenable layer exposed in step (B) remain on the elastomeric layer as a negative image of the transparency used and the areas not exposed in step (B) remain on the transparent coversheet as a positive image of the image-bearing transparency used.

In a preferred embodiment of this invention, a plurality of differently colored, photosensitive elements is used, each element in conjunction with its corresponding positive separation transparency, to form a plurality of coversheets bearing precolored, positive images. These are stacked in register to produce a multicolored positive overlay proof. The precolored photosensitive elements are preferably colored yellow, magenta, cyan, and black. Unless the photosensitive element is freshly prepared it should preferably be heated prior to exposure.

In still another embodiment of this invention there is provided a process for preparing a precolored image suitable for use in a surprint proof, said process comprising in the stated order the steps of:

(A) providing a precolored, peel-apart photosensitive element comprising, in order from top to bottom:
  (1) a strippable coversheet which is transparent to actinic radiation,
  (2) a photorelease layer, consisting essentially of a solid, oxyethylene homopolymer photorelease agent of the formula, $H(OCH_2CH_2)_nOH$, with a molecular weight greater than about 3,000;
  (3) a photohardenable layer comprising a colorant;
  (4) an essentially non-photosensitive organic elastomeric layer; and
  (5) a removable support sheet;
(B) removing the removable support sheet and adhering the element, minus the support, to a permanent support;
(C) exposing the element to actinic radiation through an image-bearing transparency;
(D) peeling the strippable coversheet from the photohardenable layer, whereby the photohardened material in the areas exposed in step (C) remains on the elastomeric layer as a negative of the transparency used and the unhardened material in the areas not exposed in step (C) remain on the coversheet as a positive of the transparency used.

In a preferred embodiment of this invention, the foregoing process is repeated several times, each time using a differently colored element and its corresponding negative separation transparency, to produce a multicolored surprint proof. The different elements and color separation transparencies preferably correspond to yellow, magenta, cyan, and black. A first image on an elastomeric layer is formed on a permanent support as described above. The removable support is then removed from a differently colored element, which is then laminated on top of the first image. The second element is then exposed in register through its corresponding separation transparency and peeled apart to produce the second image, and so on, until a full color surprint proof is formed.

DETAILED DESCRIPTION OF THE INVENTION

The invention relates to a versatile precolored photosensitive element capable of producing by a dry process both positive and negative images, as well as image reproduction processes utilizing such elements. By dry process is meant a process in which liquids need not be used.

Photorelease Layer

The photosensitive elements of the invention comprise a photorelease layer, situated between the strippable cover sheet and the photohardenable layer. The photorelease layer consists essentially of a photorelease agent which modifies the adhesive relationship between the coversheet and the photohardenable layer so that after the photohardenable layer has been exposed to actinic radiation, the unexposed (i.e., unhardened) areas of the photohardenable layer adhere more strongly to the coversheet than to the elastomeric layer and are removed with the coversheet. Conversely, the exposed (i.e., photohardened) areas of the photohardenable layer adhere more strongly to the elastomeric layer than to the coversheet and remain on the elastomeric layer when the coversheet is stripped off.

The photorelease agents of this invention are solid, polymeric compounds which consist essentially of the oxyethylene repeat unit, i.e.,

$$-[OCH_2CH_2]$$

While small amounts of co-monomers (up to about 5%) may be present in the polyoxyethylene chain, provided the polymer is still solid at room temperatures, oxyethylene homopolymers are preferred.

Oxyethylene homopolymers are generally divided in two groups, polyethylene glycols and polyethylene oxides, on the basis of molecular weight. Both groups, however, are oxyethylene homopolymers with primary hydroxyl end groups, i.e., $H(OCH_2CH_2)_nOH$.

The polyethylene glycols are a series of low to medium molecular weight homopolymers of ethylene oxide. They can be regarded chemically as polyether diols, conceptually made by the addition of ethylene oxide to water or ethylene glycol starters to form long, linear chains of oxyethylene units having primary hydroxyl groups at each end. Depending on chain length, they range in physical form at room temperature from viscous liquids (MW 200–700), through waxy semisolids (MW 1000–2000), to hard, waxlike solids (MW 3,000 to 20,000 and above).

The polyethylene oxides are a series of high molecular weight oxyethylene homopolymers. They are free-flowing white powders commercially available in a broad range of molecular weight grades, i.e., as low as 100,000 to over 5,000,000. Because of the high molecular weight of these polymers, the concentration of reactive end groups is extremely small, and, therefore, these polymers show no end-group reactivity. Polyethylene oxides are available from the Union Carbide Corporation under the tradename Polyox ®. Oxyethylene polymers are discussed in detail in Chapters 18 and 19 of *Handbook of Water-Soluble Gums and Resins*, R. L. Davidson, Ed., McGraw-Hill, N.Y., 1980.

Since the photorelease agents of this invention are coated, preferably onto the coversheet, the polymer must be of sufficient molecular weight to be a solid at ambient temperature to be useful as a photorelease agent. It must also form a film at ambient temperatures. Therefore, it is expected that only oxyethylene polymers of molecular weight greater than about 3,000 will be useful as photorelease agents. Oxyethylene polymers of molecular weight greater than about 20,000 are preferred. More preferred are oxyethylene polymers in the molecular weight range of about 100,000 to about 600,000. The most preferred photorelease agents have a molecular weight of about 300,000 to 400,000.

As is well known to those skilled in the art, the molecular weight ranges used to identify various grades of oxyethylene polymers are those provided by the manufacturers. These molecular weights are widely used by in the literature (see, for example, Chapters 18 and 19 of *Handbook of Water-Soluble Gums and Resins, ibid.; Water-Soluble Resins: An Industrial Guide.* E. W. Flick, Noyes Publications, Park Ridge, N.J., 1986, p. 211; and *Kirk-Othmer Encyclopedia of Chemical Technology*, 3rd Ed. Vol 18 Wiley N.Y. 1982, pp. 616ff).

The photorelease layer consists essentially of the photorelease agent, but it may also contain minor amounts of other ingredients that do not materially affect the basic and novel characteristics, i.e., photorelease, of the composition. Preferably the photorelease layer will contain at least 65%, and more preferably, at least 75% photorelease agent.

The photorelease layer may be 0.03 to 0.3 μm thick, preferably 0.05 to 0.2 μm, more preferably about 0.1 to 0.15 μm thick.

Other ingredients may be added to the photorelease layer to improve film performance. A surfactant may be added as a coating aid. Preferred coating aids for the photorelease layer are low molecular weight, non-ionic, polyethylene oxide/polypropylene oxide/polyethylene oxide A-B-A block co-polymers, such as Pluronic ® L-92, a surfactant manufactured by BASF, Parsippany, N.J. The coating aid may be added at 0–1% (weight/volume) of the coating solution, preferably at about 0.1% (weight/volume) of the coating solution.

Addition of poly(vinyl pyrrolidone) (PVP) to the photorelease layer improves image quality by providing cleaner separation of the coversheet when the element is peeled apart, thus reducing the number of missing dots and plugged holes. A preferred PVP is PVP K-90, a high molecular weight PVP. PVP may be added at 0–5% of total solids of the photorelease layer, preferably about 1–3%. Poly(acrylic acid) improves the aging performance and reduces the peel sensitivity, that is, the sensitivity of the quality of the image to the rate and smoothness of peeling apart of the element. Poly(acrylic acid) may be added at 0–10% of total solids of the photorelease layer, preferably about 4–10%. It should be understood that total solids refers to the total amount of nonvolatile material in the coating solution even though some of the additives may be nonvolatile liquids at ambient temperature.

Photohardenable Layer

The photohardenable layer, which is the sole photosensitive layer of the element, is one whose adhesive relationship vis-à-vis the photorelease agent-coated coversheet and the elastomeric layer is altered by exposure to actinic radiation. Before exposure, the photohardenable layer adheres more strongly to the coversheet than to the elastomeric layer. If the unexposed element is peeled apart, the photohardenable layer is removed with the cover sheet. After exposure, the unexposed (i.e., unhardened) areas of the photohardenable layer still adhere more strongly to the coversheet than to the elastomeric layer and are removed with the coversheet. However, the exposed (i.e., photohardened) areas of the photohardenable layer adhere more strongly to the elastomeric layer than to the coversheet, and will remain on the elastomeric layer if the coversheet is peeled off.

The photohardenable layer is preferably photopolymerizable, comprising an ethylenically unsaturated photopolymerizable monomer, a polymeric binder, and an initiator or initiator system which initiates free radical addition polymerization on exposure to actinic radiation. If a precolored image is desired, a colorant may also be included in the photohardenable layer. Other components may also be included as detailed herein.

Initiator Systems

The initiator/initiator system may comprise one or more compounds which directly furnish free-radicals when activated by actinic radiation. It can also comprise a plurality of compounds, one of which yields free-radicals after having been caused to do so by another compound, a sensitizer, which has been activated by the radiation. By "actinic radiation" is meant radiation which is active to produce the free-radicals necessary to initiate polymerization of the monomeric material, or to otherwise initiate photohardening.

As described in U.S. Pat. Nos. 3,427,161; 3,479,185; 3,549,367; 4,311,783; 4,622,286; and 3,784,557, preferred initiator systems are 2,4,5-triphenylimidazolyl dimers in combination with chain transfer agents, or hydrogen donors, and mixtures thereof. Useful 2,4,5-triarylimidazolyl dimers are disclosed in Baum et al., U.S. Pat. No. 3,652,275, column 5, line 44 to column 7, line 16. Preferred HABI's (hexaarylbiimidazoles) are 2-o-chlorosubstituted hexaphenylbiimidazoles in which the other positions on the phenyl radicals are unsubstituted or substituted with chloro, methyl, or methoxy. The most preferred initiators include CDM-HABI, i.e., 2-(o-chlorophenyl)-4,5-bis(m-methoxyphenyl)-imidazole dimer; o-Cl-HABI, i.e., 1,1'-biimidazole, 2,2'-bis(o-chlorophenyl)-4,4',5,5'-tetraphenyl-; and TCTM-HABI, i.e., 1H-imidazole, 2,5-bis(o-chlorophenyl)-4-[3,4-dimethoxyphenyl]-, dimer, each of which is typically used with a hydrogen donor. The teaching of the foregoing patents is hereby incorporated by reference.

Sensitizers useful with these photoinitiators include methylene blue and those disclosed in U.S. Pat. Nos. 3,554,753; 3,563,750; 3,563,751; 3,647,467; 3,652,275; 4,162,162; 4,268,667; 4,351,893; 4,454,218; 4,535,052; and 4,565,769. Useful sensitizers includes the bis(p-dialkylaminobenzylidine) ketones disclosed in Baum et al., U.S. Pat. No. 3,652,275, and the arylyidene aryl ketones disclosed in Dueber, U.S. Pat. No. 4,162,162, as well as in U.S. Pat. Nos. 4,268,667 and 4,351,893. The teaching of the foregoing patents is hereby incorporated by reference. For some applications, such as color proofing, the use of sensitizing dyes, especially those whose absorption extends well into the visible region of the spectrum, may be undesirable since such dyes may affect the color of the resulting image.

Hydrogen donor compounds useful as chain transfer agents in the photosensitive compositions include: 2-mercaptobenzoxazole, 2-mercaptobenzothiazole, 4-methyl-4H-1,2,4-triazole-3-thiol, and the like, as well as various types of compounds, e.g., (a) ethers, (b) esters, (c) alcohols, (d) compounds containing allylic or benzylic hydrogen, (e) acetals, (f) aldehydes, and (g) amides as disclosed in column 12, lines 18 to 58 of MacLachlan, U.S. Pat. No. 3,390,996, the teaching of which is hereby incorporated by reference. A preferred chain transfer agent is 2-mercaptobenzoxazole.

Although the HABI initiating systems described above are preferred, there are also many other initiating systems which may be used in the practice of this invention. Typical free radical-generating addition polymerization initiators include: quinones; ketones, such as Michler's ketone and benzophenone; dialkylamino benzaldehyde; benzaldehyde; dialkylamino benzoate esters; and combinations thereof. Other photoinitiators are described in U.S. Pat. No. 2,760,863, including vicinal ketaldonyl alcohols, such as benzoin, pivaloin; acyloin ethers, e.g., benzoin methyl and ethyl ethers; alpha-hydrocarbon-substituted aromatic acyloins, including alpha-methylbenzoin, alpha-allylbenzoin, and alpha-phenylbenzoin.

Redox systems, such as those involving dyes, e.g., Rose Bengal/2-dibutylaminoethanol, may be used. A useful discussion of dye-sensitized photopolymerization can be found in "Dye Sensitized Photopolymerization" by D. F. Eaton in *Adv. in Photochemistry*, Vol. 13, D. H. Volman, G. S. Hammond, and K. Gollinick, eds., Wiley-Interscience, N.Y., 1986, pp. 427–487. For some applications, such as color proofing, the use of dyebased initiator systems, especially those which use dyes whose absorption extends well into the visible region of the spectrum, may be undesirable since such dyes may affect the color of the resulting image.

Monomers/Binders

Materials with ethylenically unsaturated groups which are photohardenable, photopolymerizable, photocrosslinkable, and/or photodimerizable, may be used in the photohardenable layer, and are "photohardenable" within the meaning of this application. Such materials are described, for example, in Chu et al., U.S. Pat. No. 3,649,268. The preferred photohardenable compositions are photopolymerizable, and comprise a macromolecular organic polymeric binder and an addition polymerizable ethylenically unsaturated monomer. The binder can be a polar material, such as an acidic polymer containing at least 1.5 mole percent free acid groups to impart polarity to the polymer, or a nonpolar material, e.g., materials as described in Burg et al., U.S. Pat. No. 3,060,023; Chu et al., U.S. Pat. No. 3,649,268; and Collier et al., U.S. Pat. No. 3,984,244. The teaching of the foregoing patents is hereby incorporated by reference. The monomer has at least one and preferably two or more terminal ethylenically unsaturated groups capable of free-radical initiated, chain propagated, addition polymerization, and preferably has some degree of polarity. In addition, the monomer must be compatible with the binder and substantially nondiffusible into the elastomeric layer.

Useful ethylenically unsaturated monomers include trimethylolpropane triacrylate, trimethylolpropane trimethacrylate, and the triacrylate ester of ethoxylated trimethylolpropane. Other useful ethylenically unsaturated monomers may be found. Also useful are epoxy monomers containing ethylenic unsaturation, e.g., monomers of the type disclosed in Crary, U.S. Pat. No. 3,661,576, and British Pat. No. 1,006,587. A preferred monomer is Hetron® Q6332, an epoxy acrylate resin manufactured by Ashland Chemical.

Suitable binders include polymers of methyl acrylate, methyl methacrylate, and copolymers thereof. Among acidic binders, there may be mentioned co(methyl methacrylate/ methacrylic acid), co(ethylacrylate/methylmethacrylate/acrylic acid), and monoethyl ester of poly(methyl vinyl ether/ maleic anhydride), each of which may be copolymerized in various proportions. A preferred binder is poly(methyl methacrylate), which may be used in combination with an acidic co-binder.

Colorants

When it is desired to use the elements of the invention to produce a precolored image, such as a precolored, positive overlay proof or a precolored, negative surprint proof, the photohardenable layer may be colored, preferably either yellow, magenta, cyan or black. Examples of suitable colorants include:

yellow: Cromophtal® Yellow 3G (C.I. No. Pigment Yellow 93), Hostaperm® Yellow 3G (C.I. No. Pigment Yellow 154);

magenta: Monastral® Violet R (C.I. No. Pigment Violet 19), 2,9-Dimethylquinacridone (C.I. No. Pigment Red 122), Indofast® Brilliant Scarlet R6300 (C.I. No. Pigment Red 123), Quindo Magenta RV 6803;

cyan: Monastral® Blue G (C.I. No. Pigment Blue 15), Monastral® Blue (BT 383D) (C.I. No. Pigment Blue 15), Monastral® Blue G (BT 284D) (C.I. No. Pigment Blue 15), Monastral® Green GT (751D) (C.I. No. Pigment Green 7);

black: Raven® 450 (C.I. No. Pigment Black 7), Raven® 1035 (C.I. No. Pigment Black 7), Elftex® 8 (C.I. No. Pigment Black 7), Elftex® 12 (C.I. No. Pigment Black 7).

If other colors are desired, other colorants (pigments or dyes) compatible with the other ingredients present in the photohardenable layer and which do not alter the relative relationship of the adherent forces between the elastomeric layer, the coversheet coated with the photorelease agent and the hardened and unhardened areas of the photohardenable layer, may be used.

Other Ingredients

The photohardenable layer may also contain other ingredients which are conventional components used in photohardenable systems subject to the conditions that they (1) must be compatible with the other ingredients present in the photohardenable layer and (2) not alter the relative relationship of the adhesive forces between the elastomeric layer, the coversheet coated with the photorelease agent and the hardened and unhardened areas of the photohardenable layer, as required in the invention. Such components may include stabilizers, antihalation agents, optical brighteners, release agents, surfactants, coating aids, and plasticizers.

Normally a thermal polymerization inhibitor will be present to increase storage stability of the photohardenable composition. Useful thermal stabilizers include: hydroquinone, phenidone, p-methoxyphenol, alkyl- and aryl-substituted hydroquinones and quinones, tert-butyl catechol, pyrogallol, beta-naphthol, 2,6-di-tert-butyl p-cresol, 2,4,6-tri-tert-butyl phenol, phenothiazine, p-toluquinone and chloranil. The dinitroso dimers described in Pazos, U.S. Pat. No. 4,168,982, may also be useful. Since monomers generally contain thermal polymerization inhibitors added by their manufacturers, it is frequently unnecessary to add additional inhibitor.

Nonionic surfactants may be added to the photohardenable layer as coating aids. Preferred coating aids are polyethylene oxides, such as Polyox®WSRN 3000, and nonionic fluorosurfactants, such as Zonyl®FSN.

By the incorporation of optical brightening agents into the photohardenable layer, the image record is produced free from distortion due to halation effects. Suitable optical brighteners useful in the process of the invention include those disclosed in U.S. Pat. Nos. 2,784,183; 3,664,394; and 3,854,950. Preferred optical brighteners are 2-(stibyl-4")-(naphtho-1',2',4,5)-1,2,3-triazol-2"-sulfonic acid phenyl ester; 7-[(4-chloro-6-(diethylamino)-l,3,5-triazin-2-yl)amino]-3-phenyl-2H-1-benzopyran-2-one; and 2-(2'-hydroxy-3',5'-di-tert-amylphenyl)benzotriazole. Ultraviolet radiation absorbing materials useful in the invention are also disclosed in U.S. Pat. No. 3,854,950.

Release agents may be incorporated into the photohardenable composition and are described in Bauer, U.S. Pat. No. 4,326,010. A representative release agent is polycaprolactone.

Composition

The ratio of binder to monomer may vary widely, but in general should be in the range of 3:1 to 1:3. The monomer should be compatible with, and may be a solvent for, and/or have a plasticizing action on the binder. The choice and proportions of monomer and binder are made in accordance with the requirements of selective photorelease and hardness. In order to provide a suitable hardness, the monomer concentration is normally kept low so that the photohardenable layer coated from the composition will be sufficiently hard and nontacky.

For precolored photohardenable layers, the preferred compositions will normally contain, based on total weight of the photohardenable composition: 35–45% binder, 35–45% monomer, 1–15% colorant, 1–5% 2,4,5-triphenylimidazolyl dimer, 1–2% chain transfer agent, 0–1.0% sensitizer and 0–15% other ingredients.

For non-precolored photohardenable layers, the amounts of ingredients will generally be within the following percentage ranges: binder, 25–75%, preferably 45–65%; monomer, 5–60%, preferably 15–50%; initiator system 0.1% to 10%, preferably 1–5%; other ingredients 0–5%, preferably 0.5–4%.

Elastomeric Layer

The elastomeric layer may be chosen from a great number of materials. The elastomeric layer is a tacky or slightly soft, deformable organic material. For an element with good aging stability, suitable materials for the elastomeric layer should resist monomer diffusion from the photohardenable layer into the elastomeric layer. Such materials may be selected from resins, polymers in which the monomer of the photohardenable layer is substantially nondiffusible, elastomeric compositions, etc.

Preferred materials are elastomeric polymers and mixtures thereof, which are inherently tacky at ambient temperatures, or materials which will accept tackifying agents which will impart tackiness to the layer. In addition, these materials must be nonmigratory into the photohardenable layer. Rubber type polymers, both natural and synthetic may be used, e.g., poly(isobutylene); Thiokol® A; nitrile rubbers; butyl rubber; chlorinated rubbers; polymers of butadiene and/or isoprene; poly(vinylisobutylether); random, teleblock and block copolymers of butadiene or isoprene copolymerized with styrene; neoprene; silicone elastomers; etc., in various proportions. With these materials, a stable adhesion balance between the photohardenable layer and a support for the elastomeric layer may be achieved. Especially preferred materials for the elastomeric layer are polymers of butadiene or isoprene and random, teleblock and block copolymers of butadiene or isoprene copolymerized with styrene.

Coversheet/Support

The element has a strippable coversheet on which the photorelease layer is coated. The coversheet is a transparent material whose adhesive relationship with the photohardenable layer is modified by the photorelease layer, so that after the photohardenable layer has been imagewise exposed to actinic radiation, the unexposed (i.e., unhardened) areas of the photohardenable layer adhere more strongly to the coversheet than to the elastomeric layer and are removed with the coversheet. Conversely, the exposed (i.e., photohardened) areas of the photohardenable layer adhere more strongly to the elastomeric layer than to the coversheet and remain on the elastomeric layer when the coversheet is removed. Untreated polyethylene terephthalate film is preferred as the coversheet. The coversheet is transparent to actinic radiation. It must also be visually transparent and colorless when the element is to be used to prepare an overlay proof.

The elastomeric layer is also present on a support. The support may be any suitable film which has the necessary stiffness and dimensional stability and which exhibits proper adhesion to the elastomeric layer. Polyethylene terephthalate is preferred. For preparation of a negative surprint proof, a removable support is required. Silicon release-treated polyethylene terephthalate is preferred for this application.

Manufacture

The photosensitive elements of the invention may be manufactured in several different ways. For example, the photorelease agent is coated from a solvent onto the coversheet, and then, after the solvent has evaporated, the photohardenable layer is coated from an appropriate solvent over the layer of photorelease agent. After the solvent has evaporated, a release film, such as polyethylene, may be placed over the coating to protect the photohardenable layer until the rest of the element is formed. The elastomeric layer is coated onto the support. After the solvent has evaporated, the supported elastomeric layer is laminated to the photohardenable layer, photorelease layer, and coversheet, to produce an element comprising, from top to bottom: coversheet, photorelease layer, photohardenable layer, elastomeric layer, and support. If a release film is present on the photohardenable layer, it must be stripped off before lamination.

Another method is to coat the photorelease layer onto the coversheet; after drying, coat the photohardenable layer over the photorelease layer; after drying, coat the elastomeric layer over the photohardenable layer; and after drying, laminate the support onto the elastomeric layer. Alternatively, the photorelease and photohardenable layers may be coated simultaneously onto the coversheet; then the elastomeric layer, previously coated onto the support, is laminated to the photohardenable layer. Alternatively, the photorelease, photohardenable, and elastomeric layers may be coated simultaneously onto the coversheet, and the support laminated to the elastomeric layer. All of these methods are well-known to those skilled in the art of coating multilayer films.

The photorelease layer can be coated onto a polyethylene terephthalate coversheet from water, from any organic solvent in which it is soluble, or from mixtures thereof. Although numerous solvents can be used, water is the preferred coating solvent. Peel sensitivity and performance are sensitive to the coating weight of the photorelease layer. The preferred coating weight range is 0.5–2.0 mg/dm$^2$, which generally provides a dry thickness of about 0.05–0.20 $\mu$m. The dry film may be 0.03 to 0.3 $\mu$m thick, preferably 0.05 to 0.2 $\mu$m, and more preferably, about 0.1–0.15 $\mu$m thick. Good image reproduction requires formation of a discrete, uniform, continuous film.

The photohardenable layer is prepared by mixing the ingredients of the system in a solvent, such as methylene chloride, usually in the weight ratio of about 15:85 to 25:75 (solids to solvent), coating over the photorelease layer, and evaporating the solvent. Coating should be uniform. A coating weight of about 40 mg/dm$^2$, generally providing a dry thickness of about 0.004 mm is preferred. A release film, such a polyethylene, generally is placed over the coating after the solvent evaporates for protection until the rest of the element is formed.

Any suitable solvent may be used to coat the elastomeric layer. When the elastomeric layer and photohardenable layer are coated simultaneously, the solvent must not cause significant migration of the components of the elastomeric layer into the photohardenable layer. Coatings should be uniform and typically have a thickness of 3 to 15 $\mu$m, preferably 7 to 12 $\mu$m, when dry. Dry coating weight will be about 30 to 150 mg/dm$^2$, preferably 70 to 120 mg/dm$^2$. The elastomeric layer may also be coated as a dispersion, e.g., an aqueous dispersion, with satisfactory results.

Exposure/Image Formation

Any convenient source or sources of actinic radiation providing wavelengths in the region of the spectrum that overlap the absorption bands of the photoinitiator system can be used to activate photohardening/photopolymerization. By "actinic radiation" is meant radiation which is active to produce the free-radicals necessary to initiate polymerization of the monomeric material or to otherwise initiate photohardening. The radiation can be natural or artificial, monochromatic or polychromatic, incoherent or coherent, and for high efficiency should correspond closely in wavelengths to those of the photoinitiator system. Conventional light sources include fluorescent lamps, mercury, mercury-xenon, metal additive and arc lamps. Useful coherent light sources are lasers whose emissions fall within or overlap the absorption bands of the photoinitiator system.

In using the photosensitive elements of this invention to prepare overlay proofs from conventional halftone positive color separation transparencies, the precolored element is exposed to actinic radiation through the coversheet using a positive separation transparency. The coversheet is then removed from the exposed element at room temperature by stripping with a smooth, moderate to rapid continuous motion. The colored, imagewise unexposed areas of the photohardenable layer remain on the coversheet to form a single color, precolored overlay image. To form multicolor overlay proofs, this sequence of steps may be repeated with different colored elements and transparencies, and the resulting overlay images stacked in register.

In the preparation of positive overlay proofs, poor image quality may be obtained unless the photohardenable element is freshly prepared (i.e., less than about 12 hours old). Otherwise, during the peel-apart process the coversheet may not peel smoothly, but instead may undergo "slip and stick" peel behavior. During the "slip" portions of the peeling-apart process, the unexposed regions are not removed with the coversheet from the exposed element. This produces a coversheet in which the image is missing from certain areas.

Poor image quality can be prevented by using a freshly prepared element or by heating the element prior to exposure. Various methods of heating the element, for example, a heated table, an infra-red heater, or an oven, may be used. Heating by one of these methods for about 45 seconds at about 125° F. (52° C.) to 200° F. (93° C.) is adequate. Heating for 45 seconds at 210° F. (99° C.) causes poor image quality due to blurred shadow images. A preferred method of heating the element is to pass it through a Cromalin ® or similar heated laminator at a roll temperature of 190° F. (88° C.) or above up to 265° F. (129° C.) (the maximum temperature available from the laminator) at a speed of 6 ft/min (3 cm/sec).

After heating, the element should be exposed and peeled-apart within about 48 hours, preferably within about 24 hours. If the element has not been exposed within this time, it may be heated again prior to exposure without loss of image quality.

In using the photosensitive elements of this invention to prepare surprint proofs from conventional negative halftone color separation transparencies, an element with a removable support sheet is used. The removable support is removed from a film element; the element, minus the removable support, is then adhered to a receptor sheet. The resulting composite structure is exposed to actinic radiation through the coversheet using a negative separation transparency. The coversheet is then removed from the exposed element at room temperature by stripping with a smooth, moderate to rapid continuous motion. The colored, imagewise exposed areas remain on the substrate to form a single color, precolored surprint image. To form a multicolor surprint proof, another differently colored element, minus its removable support, is adhered to the image thus prepared, exposed in register through a negative separation transparency, and the coversheet removed as described above. To form multicolor surprint proofs, this sequence of steps may be repeated as many times as desired.

Although preheating of the unexposed photohardenable element may also be required in the preparation of negative surprint proofs, a separate preheating step is not necessary if the element is adhered to the receptor support or to the preceding image by heated lamination as previously described. After lamination to the receptor support, the element should be exposed and peeled-apart within about 48 hours, preferably within about 24 hours.

The receptor sheet is a material which is flat and preferably smooth, for example: films, e.g., polyethylene terephthalate of photographic grade which may be subbed as described in Alles, U.S. Pat. No. 2,779,684; adhesive subbed opaque polyethylene terephthalate film base, e.g., Melinex® 994, sold by I.C.I. Americas, Wilmington, DE; and paper stock, e.g., Kromekote® opaque white paper, Champion Paper Co., Stamford, Conn., or Cromalin® receptor stock, E. I. Du Pont, Wilmington, Del. The preferred material is an opaque white paper.

In those cases in which the photohardenable layer does not contain a colorant, the image may be developed by applying a suitable colorant, generally know as a toner. The toner adheres to the portions of the elastomeric layer which were uncovered by removal of the unpolymerized areas of the photohardenable layer, thus producing a positive image. A positive surprint proof can be produced from photohardenable elements which do not contain a colorant by following the steps described above, plus an additional step, namely toning with an appropriate toner after removal of the coversheet and before laminating on the next photosensitive element.

The various toners which may be used in the present invention are applied by a dusting treatment similar to that disclosed in Burg et al., U.S. Pat. No. 3,060,024, or by transfer as in Burg et al., U.S. Pat. No. 3,060,025. After the excess toner is removed, the particles will remain on only the uncovered elastomeric layer. Suitable toners are described in Chu et al., U.S. Pat. No. 3,620,726; Gray, U.S. Pat. No. 3,909,282; Manger et al., U.S. Pat. No. 4,215,193; and Ruskin, U.S. Pat. No. 4,661,439. From the early use of pads dipped in toners, toner application has improved as taught in Sandner, U.S. Pat. No. 4,019,821 (hand-operated toning) and Tobias, U.S. Pat. No. 4,069,791 (machine toning).

INDUSTRIAL APPLICABILITY

The elements and processes of this invention are useful for preparing colored images. These images are particularly useful in the graphic arts field, especially in the area of color proofing wherein proofs are prepared to duplicate the images produced by printing. As described earlier, the photosensitive elements of the invention can be used to prepare precolored, positive overlay proofs as well as precolored, negative surprint proofs.

The advantageous properties of this invention can be observed by reference to the following examples which illustrate, but do not limit, the invention. Molecular weights given are those indicated by the manufacturer.

EXAMPLES

| GLOSSARY | |
|---|---|
| Carboset ® 525 | Poly(ethyl acrylate/methyl methacrylate/acrylic acid) 56/37/7 copolymer; B. F. Goodrich |
| Carboset ® XPD1403 | 35% dispersion of poly(acrylic acid) (MW about 60,000) in water; B. F. Goodrich |
| Carbowax ® 20M | Polyethylene glycol (MW about 20,000); Union Carbide |
| Celrad ® 3704 | Acrylated esters of epoxy resins; |

| -continued GLOSSARY | |
|---|---|
| | Celanese Speciality Resins, Louisville, KY |
| o-Cl-HABI | 1,1'-Biimidazole, 2,2'-bis [o-chlorophenyl]-4,4',5,5'-tetraphenyl-; CAS 1707-68-2 |
| Cyan pigment | Monastral ® Blue G (BT 284D); C.I. No. Pigment Blue 15; copper phthalocyanine |
| Elvacite ® 2051 | Poly(methyl methacrylate); MW = 350,000, E. I. du Pont de Nemours and Company, Wilmington, DE |
| Epocryl ® 12 | Methacrylate ester of the epichlorohydrin adduct of bis-phenol A; Shell Chemical Company |
| Gentro ® 1506/27 | Styrene-butadiene random copolymeric rubber; Gen Corp. |
| Goodrite ® K-732 | 49.5% of Polyacrylic acid solution in water, MW 5,100; B. F. Goodrich |
| Hetron ® Q6332 | Epoxy acrylate resin; Ashland Chemical |
| Irganox ® 1010 | Tetra-bis methylene 3-(3,5-di-tert-butyl-4-hydroxyphenyl) propionate methane; Ciba-Geigy |
| Kraton ® D1107 | Styrene-isoprene-styrene block copolymer (12/86); Shell Chemical Corp. |
| Macol ® CSA 20 | Cetyl-stearyl alcohol ethoxylated with about 20 moles of ethylene oxide; Mazer Chemicals, Division of PPG Chemicals, Gurnee, IL |
| Macol ® DNP 150 | Dinonyl phenol ethoxylated with about 150 moles of ethylene oxide; Mazer Chemicals, Division of PPG Chemicals, Gurnee, IL |
| Magenta pigment | Quindo Magenta RV 6803; Harmon |
| Melinex ® 944 | Filled polyester sheet with a subbed coating; ICI |
| 2-MBO | 2-Mercaptobenzoxazole; 2-Benzoxazole-thiol; CAS 2382-96-9 |
| Methacrylate dispersant | Elveron ® 6037; Poly(methyl-methacrylate/2-ethylhexyl acrylate - Desmodur ® N adduct; Mn = 9,000, E. I du Pont de Nemours and Company, Wilmington, DE |
| Petaflex ® AF-108 | 25% Dispersion of polyacrylic acid (MW about 8,000) in ammonia water; Whittaker Corp. |
| Pluronic ® F98 | Solid (ethylene oxide/propylene oxide/ethylene oxide) A-B-A block copolymer; BASF, Parsippany, NJ |
| Pluronic ® L92 | Liquid ethylene oxide/propylene oxide/ethylene oxide) A-B-A block copolymer; BASF, Parsippany, NJ |
| Polyox ® WSRN-750 | Polyethylene oxide, MW 300,000 (stated by manufacturer); Union Carbide |
| Polyox ® WSRN-3000 | Polyethylene oxide, MW 400,000 (stated by manufacturer); Union Carbide |
| PVP K-90 | Polyvinylpyrrolidone (MW 350,000); GAF Corp. |
| Raven ® 450 | Carbon black, C.I. No. Pigment Black 7; Cities Service Co. |
| Raven ® 1035 | Carbon black, C.I. No. Pigment Black 7; Cities Service Co. |
| Scarlet Pigment | Indofast ® Brilliant Scarlet R6300; C.I. No. Pigment Red 123 |
| Taktene ® CB221 | Poly (cis-butadiene); B. F. Goodrich |
| TEOTA | Triacrylate ester of ethoxylated trimethylolpropane |
| Tinopal ® PCR | 2-(Stilbyl-4'')-(naphtho-1',2',4,5)-1,2,3-triazol-2''-sulfonic acid phenyl ester; Benzenesulfonic acid, 5-(2H-naphtho <1,2-D>-triazole-2-yl)-2-(2-phenylethyl)-, phenyl ester; CAS 6994-51-0; Ciba-Geigy, Ardsley, NY |
| Tinopal ® SFG | 7-<<4-chloro-6-(diethylamino)-1,3,5-triazin-2-yl>amin>-3-phenyl- |

-continued

GLOSSARY

| | |
|---|---|
| | 2H-1-benzopyran-2-one; CAS 5516-22-3; Ciba-Geigy, Ardsley, NY |
| Tinuvin ® 328 | 2-(2'-Hydroxy-3',5'-di-tert-amylphenyl)benzotriazole; Ciba-Geigy, Ardsley, NY |
| TMPTA | Trimethylolpropane triacrylate; 2-ethyl-2-(hydroxymethyl)-1,3-propanediol triacrylate; CAS 15625-89-5 |
| TMPTMA | Trimethylolpropane trimethacrylate; 2-ethyl-2-(hydroxymethyl)-1,3-propanediol trimethacrylate; CAS 3290-92-4 |
| Yellow Pigment | Cromophtal ® Yellow 3G; C.I. No. Pigment Yellow 93; Ciba-Geigy |
| Zonyl ® FSN | Nonionic fluorosurfactant (40% surfactant, 30% water, 30% 2-propanol); E. I. Du Pont de Nemours and Co.; CAS 65545-80-4 |
| Zonyl ® FSN-100 | Nonionic fluorosurfactant (100% surfactant); E. I. du Pont de Nemours & Co. |

In the Examples which follow it should be understood that "coating solution" refers to the mixture of solvent and additives which is coated on the coversheet, even though some of the additives may be in suspension rather than in solution, and that "total solids" refers to the total amount of nonvolatile material in the coating solution even though some of the additives may be nonvolatile liquids at ambient temperature.

Examples 1–11 illustrate the preparation of precolored, positive overlay proofs. The compositions of the colored chips used for the precolored photohardenable layers are given in Table 1. Amounts are expressed in percent by weight.

TABLE 1

| | Yellow | Magenta | Cyan | Black |
|---|---|---|---|---|
| Yellow Pigment | 40 | | | |
| Magenta Pigment | | 31.59 | | |
| Scarlet Pigment | | 8.94 | | |
| Cyan Pigment | | | 30 | |
| Raven ® 450 | | | | 20 |
| Raven ® 1035 | | | | 20 |
| Methacrylate dispersant | 10 | 20.53 | 10 | 20 |
| Elvacite ® 2051 | 50 | 38.94 | 60 | 40 |

EXAMPLE 1

This example describes the preparation of a precolored, positive, magenta overlay proof sheet.

Step 1. Coversheet and Photorelease Layer

A solution of: Polyox ® WSRN 3000 (65.5% by weight of total additives), PVP K-90 (2.0%), Petaflex ® AF-108 (15.7%; equivalent to 3.9% polyacrylic acid), Carboset ® XPD 1403 (7.5%; equivalent to 2.6% polyacrylic acid), and Pluronic ® L-92 (9.3%) in water (99.2% water; 0.8% total additives; 0.52% polyethylene oxide) (viscosity 12 cps in Brookfield viscosity with spindle #2) is coated onto the non-treated side of non-slip, clear 2 mil (0.05 mm) polyethylene terephthalate film. The solution is die coated at a coating rate of 40 ft/min (20 cm/sec). The solvent is evaporated by passing the coated film through a three zone drier. The first zone is at 150° F. (66° C.), the second at 190° F. (88° C.), and the third at 220° F. (104° C.). The coating weight is 1.3 mg/dm². The coated layer is not covered by a release film. The dried coated photorelease layer has the final composition of: Polyox ® WSRN 3000, 78.6%; PVP K-90, 2.4%; polyacrylic acid, 7.9%; Pluronic ® L-92, 11.1%.

Step 2. Precolored Photohardenable Layer

The magenta coating solution is prepared by adding the ingredients shown in the magenta column of Table 2 to methylene chloride. The monomer and binder, Hetron ® Q6332 and Evacite ® 2051, respectively, are added and dissolved first. Then the colored chips, followed by all the other ingredients, are added. All solutions are prepared under yellow light. All quantities in Table 2 are in weight percent. An amount of methylene chloride is used so that the final solution is 85% by weight methylene chloride and 15% by weight total solids.

TABLE 2

| | Yellow | Magenta | Cyan | Black |
|---|---|---|---|---|
| Colored Chips | 25.0 | 24.5 | 16.2 | 31.0 |
| Hetron ® Q6332 | 54.0 | 52.0 | 52.0 | 55.0 |
| Evacite ® 2051 | 14.53 | 17.03 | 25.33 | 7.53 |
| Carboset ® 525 | 1.0 | 1.0 | 1.0 | 1.0 |
| Polyox ® WSRN-3000 | 0.5 | 0.5 | 0.5 | 0.5 |
| Tinopal ® PCR | 0.5 | 0.5 | 0.5 | 0.5 |
| Tinopal ® SFG | 1.0 | 1.0 | 1.0 | 1.0 |
| o-Cl HABI | 2.0 | 2.0 | 2.0 | 2.0 |
| 2-MBO | 1.0 | 1.0 | 1.0 | 2.0 |
| Tinuvin ® 328 | 0.2 | 0.2 | 0.2 | 2.0 |
| Zonyl ® FSN | 0.17 | 0.17 | 0.17 | 0.17 |
| Hydroquinone | 0.1 | 0.1 | 0.1 | 0.1 |

The resulting methylene chloride solution is die coated on top of the coated photorelease layer produced in Step 1. The coating speed is 150 ft/min (46 M/min); drying temperature 190° F. (88° C.); and the coating weight 36 mg/dm². After the drying step, a polyethylene release film is pressure laminated on top of the photohardenable layer. This layer serves to provide temporary protection for the photohardenable layer until the supported elastomeric layer is added.

Step 3. Elastomeric Layer and Support

A solution of Kraton ® D1107 in methylene chloride (16% by weight Kraton ® D1107) is coated onto 3 mil (0.08 mm) hazy polyethylene terephthalate film to produce the elastomeric layer and support. The coating speed is 40 ft/min (12.2 M/min), drying temperature 170° F. (77° C.) and coating weight 105 mg/dm². After removing the protective polyethylene release film from the structure produced in Step 2, the remaining three-layer structure, i.e., precolored photohardenable layer, photorelease layer, and clear polyethylene terephthalate coversheet, is pressure laminated to the coated elastomeric layer to produce a precolored photohardenable element with the following laminated structure, from top to bottom: clear polyethylene terephthalate coversheet, photorelease layer, precolored photohardenable layer, elastomeric layer, and hazy polyethylene terephthalate support.

Step 4. Image Preparation

The freshly prepared precolored, photohardenable element produced in Step 3 is placed in a vacuum frame with a Beta Screen Target (Beta Screen Corporation, Carlstadt, N.J.) placed emulsion side down on top and a vacuum drawn before exposure. Irradiation is carried out through the Beta Screen Target and clear polyethylene terephthalate coversheet. The sample is exposed for 30 sec with a 5 kw high pressure mercury vapor lamp (Violux ® 5002S, Exposure Systems Company, Bridgeport, Conn., equipped with a photopolymer bulb) about 54 inches (about 137 cm) above the sample and integrator. Exposure is carried out less than twelve hours after the final lamination step described in Step 3. The sample is removed from the vacuum frame and placed on a vacuum easel. The clear polyethylene terephthalate coversheet is removed by peeling back at 180° ("peel-back mode") in a smooth, continuous motion at a rate of about 800 ft/min (400 cm/sec). A magenta, positive overlay image with 3-97% dots at 150 lines/in (60 lines/cm) is produced on the clear polyethylene terephthalate coversheet.

EXAMPLES 2–4

To produce the yellow, cyan, and black positive overlay images, the procedure of Example 1 is followed with the exception that the ingredients shown in the yellow, cyan, and black columns of Table 2 are each, respectively, added to methylene chloride in place of the ingredients shown in the magenta column of Table 2. After exposure of each of the precolored, photohardenable elements through a Beta Screen Target followed by peeling apart, cyan, yellow, and black positive overlay images, each with 3-97% dots at 150 lines/in (60 lines/cm), are produced on the clear polyethylene terephthalate coversheet.

EXAMPLE 5

This example illustrates the formation of a positive four-color overlay proof.

The procedures of Examples 1–4 are repeated using a set of four-color positive separation transparencies. After exposure of each precolored, photohardenable element through its respective color separation transparency and peeling apart to produce the colored overlay image, a high quality image representative of the color separation transparency used is produced on the coversheet. To produce a four-color positive overlay proof, the four images are stacked in register on a white paper (Cromalin ® receptor stock) in the following order: white paper, yellow image, magenta image, cyan image, and black image. Each of the four images has 3-97% dots at 150 lines/in (60 lines/cm).

EXAMPLE 6

This example illustrates the formation of a positive overlay proof with Carbowax ® 20 M (polyethylene glycol, MW 20,000) as the photorelease agent.

The procedure of Example 1 is repeated with the exception that a 1.5% solution of Carbowax ® 20 M in water without additional additives is coated on clear, 2 mil (0.05 mm) polyethylene terephthalate to produce the photorelease layer. The materials listed in the cyan column of Table 2 are used to prepare the precolored, photohardenable layer. Coating weight for the photorelease layer is about 2-3 mg/dm². After exposure of the precolored, photohardenable element through a Beta Screen Target followed by peeling apart, a cyan, positive overlay image with 3-97% dots at 150 lines/in (60 lines/cm) is produced on the coversheet. The complementary negative image remains on the elastomeric layer.

EXAMPLES 7–11

These examples illustrate the use of different photohardenable monomers to form magenta, positive overlay proofs. The procedure of Example 1 is repeated with each of the monomers indicated in Table 3 used in place of Hetron ® Q6332.

TABLE 3

| Example | Monomer | Image Quality[a] |
| --- | --- | --- |
| 7 | Celrad ® 3704 | 3-97% dots |
| 8 | Epocryl ® 12 | 10-90% dots |
| 9 | TMPTMA | 10-90% dots |
| 10 | TMPTA | 10-90% dots |
| 11 | TEOTA | 10-90% dots |

[a]at 150 lines/in (60 lines/cm).

EXAMPLE 12

This example describes the preparation of a precolored, negative surprint proof.

Step 1. Coversheet and Photorelease Layer

The coversheet and photorelease layer are prepared as described in Example 1 with the exception that the photorelease layer is coated onto 0.5 mil (0.013 mm), instead of 2 mil (0.05 mm) polyethylene terephthalate film.

Step 2. Photohardenable Layers

The four precolored, photohardenable layers are prepared following the procedures of Examples 1–4. Each photohardenable composition is coated on top of the coated photorelease layer produced in Step 1 following the procedure of Example 1.

Step 3. Elastomeric Layer and Removable Support

A solution of Gentro ® 1506/27 (20% by weight of total solids) and Taktene ® CB221(80%) in methylene chloride (8% by weight solids) is coated onto 1 mil (0.025 mm) silicon release treated polyethylene terephthalate film following the procedure of Example 1. The coating weight is 105 mg/dm². The polyethylene release film is removed from each of the precolored photohardenable layers produced in Step 2 and the precolored photohardenable layer, photorelease agent, and clear polyethylene terephthalate coversheet, is pressure laminated to the coated elastomeric layer so that each of the final precolored photohardenable elements has the following laminated structure, from top to bottom: polyethylene terephthalate coversheet, photorelease layer, precolored photohardenable layer, elastomeric layer, and silicon release polyethylene terephthalate removable support.

Step 4. Proof Preparation

Step A: The silicon release treated polyethylene terephthalate support is removed from the yellow precolored element produced in Step 3 and the element, minus the support, laminated at 225° F. (107° C.) to a receptor sheet (Cromalin ® receptor stock) so that the elastomeric layer is is direct contact with the receptor stock. All subsequent film laminations were carried out in this fashion.

Step B: The laminated structure produced in Step A is placed in a vacuum frame with the yellow negative color separation of the desired test picture on top and vacuum drawn before exposure. The sample is exposed through the negative separation transparency and polyethylene terephthalate coversheet and peeled apart following the procedure of Example 1.

Step C: By the procedure of Step A, the magenta precolored element is laminated to the yellow image prepared in Steps A–B. Step B is repeated except the magenta separation is used in register with the previously prepared yellow image.

Step D: By the procedure of Step A, the cyan precolored photohardenable element is laminated to the two-color image prepared in Steps A–C. Step B is repeated except the cyan separation is used in register with the previously prepared two-color image.

Step E: By the procedure of Step A, the black precolored photohardenable element is laminated to the three-color image prepared in Steps A–D. Step B is repeated except the black separation is used in register with the previously prepared three-color image.

Step F: For protection an adhesive which had been coated on polyethylene terephthalate is laminated to the four-color proof prepared in Steps A–E. A high quality (5–95% dots) negative, precolored surprint proof is thus produced.

EXAMPLE 13

A solution of Polyox® WSRN 3000 (0.35%) in methylene chloride is board coated onto the non-treated side of nonslip, clear 2 mil (0.05 mm) polyethylene terephthalate film using a coating knife with a 2 mil (0.05 mm) blade. The coversheet is removed from a magenta photopolymerizable element identical in composition and structure to that described in Example 1 of Taylor, U.S. Pat. No. 4,489,154. The photorelease agent coated coversheet is pressure laminated to the resulting element to produce a precolored, photohardenable element with the following laminated structure: coversheet, photorelease layer, photohardenable layer, elastomeric layer, and support.

The precolored, photohardenable element is exposed through a Bychrome Calibrated Screen Tints Target (Bychrome Company, Columbus, Ohio) and the coversheet removed by peeling back at 180° in a smooth, continuous motion as described above (Example 1, Step 4). A magenta, positive overlay image with 20–95% dots at 100 lines/in (40 lines/in) is produced on the clear polyethylene terephthalate coversheet.

EXAMPLE 14 AND CONTROL EXAMPLES A–D

A solution of each of the indicated photorelease agents (2%) and Pluronic® L-92 (0.1%) in water is board coated onto the non-treated side of nonslip, clear 2 mil (0.05 mm) polyethylene terephthalate film using a coating knife with a 2 mil (0.05 mm) blade. After the coating has been allowed to dry for at least 2 hr, the cyan photohardenable composition described in Example 1 above is board coated onto the photorelease agent using a coating knife with a 2 mil (0.05 mm) blade. The resulting structure (coversheet, photorelease agent, photohardenable layer) is laminated onto the elastomeric layer and support prepared in Step 3 of Example 1 to produce a precolored, photohardenable element with the following precolored, photohardenable element: coversheet, photorelease layer, photohardenable layer, elastomeric layer, and support.

Each laminated structure is exposed through a Bychrome Calibrated Screen Tints Target (Bychrome Company, Columbus, Ohio) and the coversheet removed by peeling back at 180° in a smooth, continuous motion as described above (Example 1, Step 4). A good image is obtained with Carbowax® 20M as the photorelease agent. No image is produced with each of the following as the photorelease agent: Pluronic® F-98; Macol® DNP 150; Macol® CSA 20; and polyethylene glycol methyl ether (MW 5,000).

EXAMPLE 15 AND CONTROL EXAMPLE E

This example illustrates the preparation of a magenta precolored, positive overlay proof from an aged, precolored, photohardenable element using a preheating step prior to exposure.

A magenta precolored photohardenable element, prepared as described in Example 1 and aged for two weeks at ambient temperature and humidity, is run through a Cromalin® laminator at about 220° F. (104° C.) at a speed of 6 ft/min (3 cm/sec). Within twenty-four hours it is exposed and peeled apart as described in Example 1. A magenta, positive overlay image with 3–97% dots at 150 lines/in (60 lines/cm), equivalent in quality to that produced with a freshly prepared precolored photohardenable element, is produced on the clear polyethylene terephthalate coversheet.

When the preheating step is omitted and the aged, precolored photohardenable element is exposed and peeled apart as described in Example 1, parts of the image are not removed with the coversheet. A precolored positive overlay image in which certain areas of the image are missing is produced.

EXAMPLES 16–18 AND CONTROL EXAMPLES F–H

These examples illustrate the preparation of yellow, cyan, and black precolored, positive overlay proofs from aged, precolored, photohardenable elements using a preheating step prior to exposure.

To produce the yellow, cyan, and black positive overlay images the procedure of Example 15 is followed with the exception that yellow, cyan, and black precolored photohardenable elements, prepared as described in Examples 2–4 and aged for two weeks at ambient temperature and humidity, are used. After each element is run through a Cromalin® laminator, exposed, and peeled-apart as described in Example 15, yellow, cyan, and black positive overlay images with 3–97% dots at 150 lines/in (60 lines/cm), equivalent in quality to those produced with freshly prepared precolored photohardenable elements, are produced on the clear polyethylene terephthalate coversheet.

When the preheating step is omitted and the aged, precolored photohardenable elements are exposed and peeled apart as described in Example 1, parts of the images are not removed with the coversheets. Precolored positive overlay images in which certain areas of the image are missing are produced.

EXAMPLE 19

This example illustrates the formation of a positive four-color overlay proof from aged, precolored photohardenable elements using a preheating step prior to exposure.

The procedures of Examples 15–18 are repeated using a set of four color separation transparencies. After preheating, exposure of each precolored, photohardenable element through its respective color separation transparency, and peeling apart of the colored overlay images, a high quality image representative of the color separation transparency used is produced on the coversheet. To produce a four-color positive overlay proof, the four images are stacked in register on a white paper (Cromalin® receptor stock) in the following order: white paper, yellow image, magenta image, cyan image, and black image. Each of the four images has 3–97% dots at 150 lines/in (60 lines/cm).

EXAMPLE 20

This example illustrates the preparation of a precolored, positive, four-color overlay proof.

Step 1. Coversheet and Photorelease Layer

A solution of Polyox® WSRN-750 (72.5% by weight of total additives), PVP K-90 (2.0%), Goodrite® K-732 (15.6% of total additives, equivalent to 7.7% polyacrylic acid), and Pluronic® L92 (10.2%) in water (99.2% water; 0.8% by weight total additives) is coated onto the non-treated side of nonslip, clear 2 mil (0.05 mm) polyethylene terephthalate film as described in Step 1 of Example 1. The dried coated photorelease layer has the final composition of: Polyox® WSRN-750, 78.4%; PVP K-90, 2.2%; polyacrylic acid, 8.3%; and Pluronic® L-92, 11.1%.

Step 2. Precolored Photohardenable Layer

Coating solutions for the precolored photohardenable layers are prepared by following the procedures of Step 2 of Example 1 and the corresponding steps of Examples 2–4 using the ingredients shown in Table 4. The coating solution is 87% by weight methylene chloride and 13% total solids. The solution is die coated on top of the photorelease layer produced in the Step 1 above. The coating speed is 130 ft/min (40 M/min); drying temperature 190° F. (88° C.); and the coating weight of 36 mg/dm². After the drying step, a polyethylene release film is pressure laminated on top of the photohardenable layer to give a structure of: 2 mil (0.05 mm) polyethylene terephthalate film, photorelease layer, photohardenable layer, and polyethylene film.

TABLE 4

|  | Yellow | Magenta | Cyan | Black |
| --- | --- | --- | --- | --- |
| Colored Chips | 25.0 | 24.5 | 16.2 | 31.0 |
| Hetron ® Q6332 | 54.0 | 52.0 | 52.0 | 55.0 |
| Elvacite ® 2051 | 14.61 | 17.11 | 25.41 | 7.61 |
| Carboset ® 525 | 1.0 | 1.0 | 1.0 | 1.0 |
| Polyox ® WSRN-3000 | 0.5 | 0.5 | 0.5 | 0.5 |
| Tinopal ® PCR | 0.5 | 0.5 | 0.5 | 0.5 |
| Tinopal ® SFG | 1.0 | 1.0 | 1.0 | 1.0 |
| o-Cl HABI | 2.0 | 2.0 | 2.0 | 2.0 |
| 2-MBO | 1.0 | 1.0 | 1.0 | 2.0 |
| Tinuvin ® 328 | 0.2 | 0.2 | 0.2 | 2.0 |
| Zonyl ® FSN-100 | 0.09 | 0.09 | 0.09 | 0.09 |
| Hydroquinone | 0.1 | 0.1 | 0.1 | 0.1 |

Step 3. Elastomeric Layer and Support

The elastomeric layer and support are prepared by following the procedure of Step 3 of Example 1. The precolored photohardenable elements are prepared from the structures produced in Step 2 and the elastomeric layer and support following the procedure given in Step 3 of Example 1.

Step 4. Image Preparation

Following the procedure of Step 4 of Example 1 and the corresponding steps of Examples 2–4 a set of four precolored, positive overlay images, each with 3–97% dots at 150 lines/in (60 lines/cm), is produced on the clear polyethylene terephthalate coversheets. To produce a precolored, positive, four-color overlay proof, the images are stacked in register on white paper (Cromalin® receptor stock) following the procedure of Example 5.

Had the photohardenable elements been allowed to age before exposure, a preheating step prior to exposure as described in Example 19, would have been used.

What is claimed is:

1. A multilayer, peel-apart photosensitive element comprising, in order from top to bottom:
   (1) a strippable coversheet which is transparent to actinic radiation;
   (2) a photorelease layer, consisting essentially of a solid, oxyethylene homopolymer photorelease agent of the formula, $H(OCH_2CH_2)_nOH$, with a molecular weight greater than about 3,000;
   (3) a photohardenable layer, optionally containing a colorant;
   (4) an essentially non-photosensitive organic elastomeric layer; and
   (5) a support sheet.

2. An element of claim 1, wherein the solid, oxyethylene homopolymer photorelease agent has a molecular weight of at least about 20,000.

3. An element of claim 2, wherein the solid, oxyethylene homopolymer photorelease agent has a molecular weight of about 100,000 to about 600,000.

4. An element of claim 3, wherein the solid, oxyethylene homopolymer photorelease agent has a molecular weight of about 300,000 to about 400,000.

5. An element of claim 1, wherein the photorelease layer is about 0.05 μm to about 0.2 μm thick.

6. An element of claim 5, wherein the photorelease layer is about 0.1 μm to about 0.15 μm thick.

7. An element of claim 2, wherein the photorelease layer is about 0.05 μm to about 0.2 μm thick.

8. An element of claim 7, wherein the photorelease layer is about 0.1 μm to about 0.15 μm thick.

9. An element of claim 3, wherein the photorelease layer is about 0.05 μm to about 0.2 μm thick.

10. An element of claim 9, wherein the photorelease layer is about 0.1 μm to about 0.15 μm thick.

11. An element of claim 4, wherein the photorelease layer is about 0.1 μm to about 0.15 μm thick.

12. An element of claim 3, wherein the photorelease layer contains about 4% to about 10% by weight poly(acrylic acid).

13. An element of claim 12, wherein the photorelease layer contains at least 75% by weight of the photorelease agent and about 4% to about 10% by weight of poly(acrylic acid).

14. An element of claim 1, wherein the photohardenable layer is photopolymerizable, comprising a polymeric binder; an addition polymerizable, ethylenically unsaturated monomer; and an initiator or initiator system activatable by actinic radiation.

15. An element of claim 14, wherein the photopolymerizable layer comprises about 35–45% polymeric binder, 35–45% monomer, 1–15% colorant, 2–8% initiator or initiator system, and 0–15% other ingredients.

* * * * *